United States Patent [19]

Shiraishi

[11] Patent Number: 5,499,137
[45] Date of Patent: Mar. 12, 1996

[54] EXPOSURE METHOD AND APPARATUS THEREFOR

[75] Inventor: Naomasa Shiraishi, Kawasaki, Japan

[73] Assignee: Nikon Corporation, Tokyo, Japan

[21] Appl. No.: 427,739

[22] Filed: Apr. 24, 1995

Related U.S. Application Data

[63] Continuation of Ser. No. 347,224, Nov. 23, 1994, abandoned, which is a continuation of Ser. No. 144,490, Nov. 1, 1993, abandoned, which is a continuation of Ser. No. 938,206, Sep. 1, 1992, abandoned.

[30] Foreign Application Priority Data

Sep. 6, 1991 [JP] Japan .................................. 3-227121

[51] Int. Cl.⁶ .......................... G02B 27/46; G03B 27/42; G03B 27/72
[52] U.S. Cl. ........................... 359/564; 355/53; 355/71
[58] Field of Search ................. 359/558, 559, 359/561, 562, 563, 564, 622; 250/398; 430/4, 5; 355/53, 71

[56] References Cited

U.S. PATENT DOCUMENTS

| | | | |
|---|---|---|---|
| 4,947,413 | 8/1990 | Jewell et al. ............................ | 359/563 |
| 4,952,815 | 8/1990 | Nishi ........................................ | 250/548 |
| 5,126,220 | 6/1992 | Tokitomo et al. ....................... | 250/398 |
| 5,307,207 | 4/1994 | Ichihara ................................... | 359/622 |
| 5,335,044 | 8/1994 | Shiraishi .................................. | 355/53 |

FOREIGN PATENT DOCUMENTS 62-50811  10/1987  Japan .

*Primary Examiner*—Martin Lerner
*Attorney, Agent, or Firm*—Shapiro and Shapiro

[57] ABSTRACT

In an exposure method of illuminating a pattern formed on a mask with illumination light from an illumination optical system, and projecting/exposing an image of the pattern on a photosensitive substrate through a projection optical system, the pattern includes a transmission portion having a transmittance of about 1 with respect to the illumination light and a phase shift transmission portion which provides a phase difference of about $(2n+1)\pi$ (n is an integer) with respect to the light transmitted through the transmission portion, and has a pattern width not more than a resolving limit of the projection optical system. The illumination light passing through a predetermined plane which is substantially coincident with a Fourier transform plane of the mask in the illumination optical system or a conjugate plane thereto, is limited to at least one local region having the center at a position shifted from an optical axis of the illumination optical system, thereby inclining the illumination light radiated on the mask at an angle corresponding to fineness of the pattern in a predetermined direction.

9 Claims, 6 Drawing Sheets

EXPOSURE METHOD AND APPARATUS THEREFOR

This is a continuation of application Ser. No. 08/347,224 filed Nov. 23,1994, now abandoned which is a continuation of application Ser. No. 08/144,490 filed Nov. 1, 1993, now abandoned which is a continuation of application Ser. No. 07/938,206 filed Sep. 1, 1992, now abandoned.

BACKGROUND OF THE INVENTION

1. Field of the Invention

The present invention relates to an exposure method and an apparatus therefor in pattern formation techniques for semiconductor elements, liquid crystal display elements, and the like.

2. Related Background Art

A photolithographic process, in which a circuit pattern such as a semiconductor element is formed, generally employs a method of transferring a pattern formed on a reticle (mask) onto a substrate such as a semiconductor wafer. A photoresist having photosensitive properties is applied to the surface of the substrate, and a circuit pattern is transferred to the photoresist in accordance with an illumination light image, i.e., the shape of a transparent pattern of the reticle. In a projection exposure apparatus (e.g., a stepper), an image of the reticle pattern is focused/projected on the substrate (wafer) through a projection optical system.

In an apparatus of this type, illumination light is limited to an almost circular (rectangular) shape centered on the optical axis of an illumination optical system within a plane of the illumination optical system (to be referred as an illumination optical system pupil plane hereinafter) serving as a Fourier transform plane on a surface of a reticle on which a pattern exists, or within an adjacent plane, thus illuminating the reticle. For this reason, the illumination light is incident on the reticle at right angle. In addition, a circuit pattern is drawn on a reticle (a glass substrate constituting of quartz or the like) used in this apparatus. The circuit pattern is constituted by transmission portions (substrate bare surface portions), each having a transmittance of nearly 100% with respect to illumination light, and light-shielding portions (consisting of chromium or the like), each having a transmittance of nearly 0%.

The illumination light radiated on the reticle is diffracted by the reticle pattern, and a 0th-order diffracted light component and ±1st-order diffracted light components are generated by the pattern. These diffracted light components are focused by a projection optical system to form interference fringes, i.e., an image of the reticle pattern, on the wafer. An angle θ (reticle side) defined by the 0th-order diffracted light component and each of the ±1st-order diffracted light components are determined according to $\sin\theta = \lambda/P$, where the wavelength of exposure light is represented by $\lambda$ (μm), and the pitch of the reticle pattern is P.

As the pattern pitch decreases, sinθ increases. In addition, when sinθ exceeds the reticle-side numerical aperture (NA) of the projection optical system, the ±1st-order diffracted light components are limited by the effective size of a plane of the projection optical system (to be referred to as a projection optical system pupil plane hereinafter) serving a Fourier plane of the reticle pattern and cannot pass through the projection optical system. That is, only the 0th-order diffracted light component reaches the wafer, and no interference fringes reticle pattern image) will be formed.

In the conventional apparatus described above, therefore, if the reticle constituted by only the transmission portions and the light-shielding portions is used, the fineness (minimum pattern pitch) P of a reticle pattern which can be formed on a wafer is given by $P \approx \lambda/NA$ based on $\sin\theta = NA$.

Since the minimum pattern size is ½ the pitch P, the minimum pattern size is about 0.5×λ/NA. In a practical photolithographic process, however, a given depth of focus is required due to wafer warping, the influence of a step formed in the wafer in the process, and the thickness of the photoresist itself. For this reason, a practical minimum resolution pattern size is represented by k×λ/NA where k is the process coefficient which falls within the range of about 0.6 to about 0.8.

As will be appreciated from the above description, in the conventional exposure apparatus, in order to transfer a finer pattern, an exposure light source having a shorter wavelength or a projection optical system having a larger numerical aperture must be used.

It is, however, difficult to decrease the wavelength of the exposure light source (to a wavelength of 200 nm or less) at present because an appropriate optical material which can be used as a transmission optical member does not exist and a stable light source which can provide a large amount of light is not available. In addition, the numerical aperture of the state-of-the-art projection optical system is almost a theoretical limit, and hence an increase in numerical aperture is almost impossible. Even if the numerical aperture can be larger than that currently used, the depth of focus determined by $\pm\lambda/NA^2$ abruptly decreases with an increase in numerical aperture. Consequently, the depth of focus used in practice further decreases, and the exposure apparatus cannot be used as a practical apparatus.

Under the circumstances, there has been proposed a phase shift reticle which has a phase shifter (a dielectric thin film or the like) for shifting the phase of light transmitted through a specific portion, of all the transmission portions of the circuit pattern of the reticle, from the phase of light transmitted through other transmission portions by π (rad). Specifically, a spatial frequency modulation type phase shift reticle is disclosed in, e.g., Japanese Patent Publication No. 62-50811. The use of a phase shift reticle of this type allows transfer of a finer pattern. That is, the resolving power can be improved.

Various types of phase shift reticles have been proposed so far. Typical examples are of a spatial frequency modulation type, a shifter light-shielding type, and an edge emphasizing type. The differences in focusing characteristics between the spatial frequency modulation type phase shift reticle, the shifter light-shielding type phase shift reticle, the conventional reticle, and the edge emphasizing type phase shift reticle will be briefly described below with reference to FIGS. 10A to 13.

FIG. 10A is a view for explaining the arrangement of the spatial frequency type phase shift reticle. As shown in FIG. 10A, light-shielding patterns 12c are arranged on a reticle (glass substrate) 11A at a pitch $P_0$, and a phase shifter is formed on one of two transmission portions sandwiching each light-shielding pattern 12c. Therefore, opening portions (pitch $P_0$) other than the light-shielding patterns 12c are alternately constituted by transmission portions 12a and phase shift transmission portions 12b. With this arrangement, the amplitude of light transmitted through the reticle 11A becomes +1 (=exp(2πix0)) at each transmission portion 12a; and −1 (=exp(2πixπ)) at each phase shift transmission portion 12b. That is, a pitch $P_A$ (the pitch of the transmission portions 12a) from +1 to +1 is twice the pitch $P_0$ of the light-shielding patterns 12c. Hence, the spatial frequency (degree of modulation in the lateral direction in FIG. 10A) of the transmitted light is reduced to ½. That is, the pitch is doubled.

In this case, a 1st-order diffracted light component is generated by such a pattern in a direction defined by $\sin\theta_A = \lambda/P_A$, but no 0th-order diffracted light component is generated because light transmitted through each transmission portion 12c and light transmitted through each phase shift transmission portion 12b cancel each other. If, therefore, illumination light is incident on the reticle 11A at substantially a right angle, the light (diffracted light) propagates between a projection optical system 13A and a wafer 14A, as shown in FIG. 10B. That is, only ±1st-order diffracted light components $D_{pA}$ and $D_{mA}$ reach the wafer. As a result, interference fringes are formed on the wafer 14A by the +1st-order diffracted light component $D_{pA}$ and −1st-order diffracted light component $D_{mA}$ to produce a light intensity distribution EA, as shown in FIG. 10B. This light intensity distribution represents images of the patterns 12a to 12c on the reticle.

FIG. 11A is a view for explaining the arrangement of the shifter light-shielding type phase shift reticle. Referring to FIG. 11A, phase shift patterns 12b, each having a width equal to or larger than the resolving limit of a projection optical system 13B (FIG. 11B), are formed on a reticle (glass substrate) 11B at a pitch $P_B$ by patterning. Assume that the pitch $P_B$ is equal to the pitch $P_0$ in FIG. 10A. In the shifter light-shielding type shown in FIG. 11A, the spatial frequency of the amplitude of transmitted light remains $P_B$. Therefore, each 1st-order diffracted light component is generated by this pattern in a direction $\theta_B$ defined by $\sin\theta_B = \lambda/P_B$ with respect to a 0th-order diffracted light component.

Note that the diffraction angle $\theta_B$ is almost twice the diffraction angle $\theta_A$ in FIG. 10A. If, therefore, the pattern pitch $P_B$ decreases, ±1st-order diffracted light components $D_{pB}$ and $D_{mB}$ cannot pass through the projection optical system 13B, as shown in FIG. 11B. In this case, since only a 0th-order diffracted light component $D_{0B}$ reaches a wafer 14B, interference fringes based on 0th- and ±1st-order diffracted light components are not formed, thus obtaining a flat light intensity distribution EB. That is, no reticle pattern images are formed.

In this case, in order to form pattern images on the wafer, $\sin\theta_B < NA_R$ (where $NA_R$ is the reticle-side numerical aperture of the projection optical system 13B) must be satisfied, as described above. Therefore, the minimum pattern pitch $P_B$ allowing transfer of patterns in FIG. 11B is given by $P_B > \lambda/NA_R$ according to $\sin\theta_B = \lambda/P_B$.

On the other hand, in the spatial frequency modulation type shown in FIG. 10A, since $\sin\theta_A = \lambda/P_A < NA_R$, and $P_A = 2P_0 = 2P_B > \lambda/NA_R$, the minimum pattern pitch $P_0$ at which patterns can be transferred is represented by $P_0 > \lambda/(2 \cdot NA_R) = P_B/2$. Therefore, the spatial frequency modulation type phase shift reticle allows transfer of patterns at a pitch ½ that set in the shifter light-shielding type phase shift reticle.

FIG. 12A is a view for explaining the arrangement of the conventional reticle. Referring to FIG. 12A, light-shielding (chromium) patterns 12c are formed on a reticle (glass substrate) 11c at a pitch $P_c$ by patterning. Assume that the pitch $P_c$ is equal to the pitch $P_B$ in FIG. 11A. Hence, the spatial frequency of light transmitted through the reticle 11c (transmission portion 12a) is equal to that of the light transmitted through the shifter light-shielding type phase shift reticle shown in FIG. 11A. Consequently, a generation direction (diffraction angle) $\theta_c$ of each 1st-order diffracted light component from this pattern is equal to the diffraction angle $\theta_B$ in FIG. 11B. Similar to the shifter light-shielding type, as the pattern pitch $P_c$ decreases, ±1st-order diffracted light components $D_{pC}$ and $D_{mC}$ cannot pass through a projection optical system 13C, and only a 0th-order diffracted light component $D_{0C}$ reaches a wafer 14C. As a result, a flat light intensity distribution EC is obtained, and no reticle pattern images are formed. That is, there is no difference between the shifter light-shielding type phase shift reticle and the conventional reticle in the minimum pattern pitch at which patterns can be transferred to a wafer.

FIG. 13 is a view for explaining the arrangement of the edge emphasizing type phase shift reticle. Referring to FIG. 13, light-shielding patterns 12c are formed on a reticle (glass substrate) 11D at a pitch $P_D$ by patterning, and a phase shifter 12b is formed only around each transmission portion 12a. Although a detailed description of the edge emphasizing type phase shift reticle will be omitted, an improvement in resolution cannot be theoretically expected, similar to the shifter light-shielding type phase shift reticle.

The use of the spatial frequency modulation type phase shift reticle allows formation of a finer pattern than that formed by the conventional reticle. However, it is difficult to manufacture the spatial frequency modulation type phase shift reticle. For example, since the conventional reticle is constituted by only light-shielding portions and transmission portions (reticle bare surface portions), the conventional reticle can be obtained by forming light-shielding portions on the glass substrate by one patterning operation. In contrast to this, the formation of the spatial frequency modulation type phase shift reticle requires at least a total of two patterning operations, including not only patterning for forming light-shielding portions but also patterning for forming phase shifters on transmission portions.

On the other hand, since the shifter light-shielding type phase shift reticle is constituted by only phase shift transmission portions and transmission portions (substrate bare surface portions), patterning is not required for forming light-shielding portions (each constituted by a metal film or the like). Therefore, the phase shift reticle of this type can be completed by forming phase shifters on the glass substrate by one patterning operation to form fine (a pattern width equal to or smaller than the resolving limit of the projection optical system) phase shift patterns on a circuit pattern portion (corresponding to the dark portion of a projected image on the wafer). However, as long as a general (conventional) illumination optical system is used, an improvement in resolution cannot be expected from the shifter light-shielding type reticle.

In addition, similar to the shifter light-shielding type, an improvement in resolution cannot be expected from the edge emphasizing type phase shift reticle. Furthermore, the phase shift reticle of this type demands accurate positioning between the light-shielding patterns and the phase shift patterns. It is, however, reported that positioning of these patterns in the edge emphasizing type can be performed in a self-aligned manner.

SUMMARY OF THE INVENTION

The present invention has been made in consideration of the above problems, and has as its object to provide an exposure method and an apparatus therefor, which enable an improvement in resolution and depth of focus to the same degree as that achieved by a spatial frequency modulation type phase shift reticle by using a shifter light-shielding type (or edge emphasizing type) phase shift reticle which is easy to manufacture.

In order to achieve the above object, according to the present invention, a fine pattern group (12) on a mask is illuminated with illumination light from an illumination optical system (1–10) to project/expose an image of the fine pattern group (12) on a photosensitive substrate (14) through a projection optical system (13). Each fine pattern of the fine pattern group (12) is constituted by a transmission portion (12a) having a transmittance of about 1 with respect to the illumination light, and a phase shift transmission portion (12b) which provides a phase difference of about $(2n+1)\pi$ (n is an integer) with respect to light transmitted through the transmission portion (12a), and a pattern width is equal to or smaller than the resolving limit of a projection optical system. Illumination light passing through a predetermined plane in the illumination optical system which is substantially coincident with a Fourier transform plane of a surface of the mask (11) on which the fine pattern group (12) is formed, or with a conjugate plane thereof, is limited to at least one local region; having the center at a position shifted from an optical axis (AX) of the illumination optical system, thereby inclining the illumination light radiated on the mask (11) at an angle corresponding to the fineness of the fine pattern group (12) in a predetermined direction.

In addition, according to the present invention, there may be used a phase shift mask constituted by a transmission portion having a transmittance of about 1 with respect to illumination light, a light-shielding portion having a transmittance of about 0 with respect to illumination light, and a phase shift transmission portion which provides a phase difference of about $(2n+1)\pi$ (n is an integer) with respect to the light transmitted through the transmission portion. The illumination light is inclined at an angle corresponding to the fineness of a fine pattern group in a predetermined direction to be incident on the mask. This is achieved by limiting illumination light which passes through a predetermined plane which is substantially coincident with a Fourier transform plane of the mask in the illumination optical system, or with a conjugate plane thereof, to position shifted from the optical axis of the illumination optical system.

The angle of illumination light incident on the mask is determined by the line width and periodicity of each fine pattern of a fine pattern group. The direction of the illumination light is determined by the directional property of each fine pattern. The central position of a local region through which the illumination light passes within the predetermined plane is adjusted in accordance with the angle and direction of the illumination light.

The present invention may use a so-called shifter light-shielding type phase shift mask having a circuit mask constituted by a transmission portion (mask bare surface portion) with a transmittance of about 1 with respect to illumination light and a phase shift transmission portion which provides a phase difference of about $(2n+1)\pi$ (n is an integer) with respect to the light transmitted through the transmission portion, a pattern width of the mask being equal to or smaller than the resolving limit of the projection optical system. The invention may also use a so-called edge emphasizing type phase shift mask having a circuit pattern constituted by a transmission portion (mask bare surface portion) with a transmittance of about 1 with respect to illumination light, a light-shielding portion having a transmittance of about 0 with respect to illumination light, and a phase shift transmission portion which provides a phase difference of about $(2n+1)\pi$ (n is an integer) with respect to the light transmitted through the transmission portion and a pattern width of the mask is equal to or smaller than the resolving limit of the projection optical system. In addition, illumination light is inclined at an angle corresponding to the fineness of the fine pattern group in the predetermined direction to be incident on the mask by limiting the illumination light, passing through a predetermined plane which is substantially coincident with a Fourier transform plane of the mask in the illumination optical system, or with a conjugate plane thereof, to at least one local region having the center at a position shifted from the optical axis of the illumination optical system.

With this arrangement, one of ±1st-order diffracted light components generated by a fine mask pattern having a pattern width equal to or smaller than the resolving limit of the projection optical system of the conventional illumination scheme can pass through the projection optical system (pupil plane) because the illumination light is inclined. Therefore, one of the ±1st-order diffracted light components and a 0th-order diffracted light component, i.e., two light components, reach the wafer, and interference fringes, i.e., an image of the reticle pattern, will be formed by the two light components.

When oblique illumination is performed with respect to the shifter light-shielding type or edge emphasizing type phase shift reticle, the light amount ratio of diffracted light components generated by the mask pattern, especially the ratio of the amount of one of the ±1st-order diffracted light components to that of the 0th-order diffracted light component is closer to 1:1 than that in the case of the conventional reticle. Consequently, the contrast of interference fringes (an image of the reticle pattern) caused by the two light components is improved, and a better image can be obtained as a pattern image.

Furthermore, the central position of each local region, within the pupil plane of the illumination optical system, through which illumination light passes can be changed. For this reason, optimal illumination can be performed in accordance with the line width and directional property of a pattern, thereby improving the resolution of the pattern and the depth of focus.

As described above, according to the present invention, by performing oblique illumination with respect to the shifter light-shielding type or edge emphasizing type phase shift reticle, which is relatively easy to manufacture, the resolution and the depth of focus can be improved to a degree sufficient to achieve; to almost the same effect as in the case wherein the spatial frequency modulation type phase shift reticle, which is difficult to manufacture, is used.

In addition, as compared with the case of the conventional reticle (constituted by only a transmission portion and a light-shielding portion), the amount of light transmitted through a large-area transmission portion other than a pattern portion can be reduced to a small value relative to the amount of light transmitted through the pattern portion, thereby preventing light from propagating from the large-area transmission portion other than the pattern portion and obtaining a good resist profile.

Moreover, if oblique illumination is performed with respect to the shifter light-shielding type or edge emphasizing type phase shift reticle, a conventional high-performance positive resist can be used without any modification.

DESCRIPTION OF THE PREFERRED EMBODIMENTS

Figure 1:
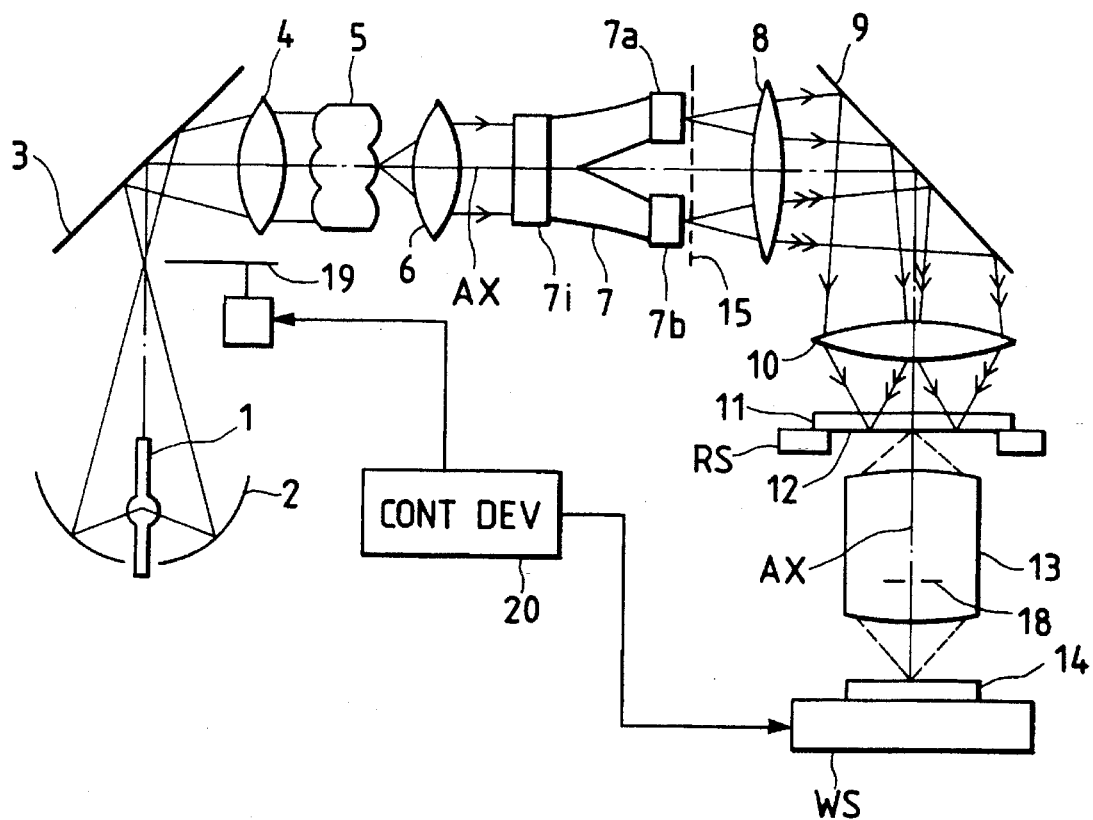
FIG. 1 is a view showing a schematic arrangement of a projection exposure apparatus according to an embodiment of the present invention.

FIG. 1 is a view showing a schematic arrangement of a projection exposure apparatus according to an embodiment of the present invention. Referring to FIG. 1, illumination light (e.g., an i ray or a KrF excimer laser beam) generated by a light source 1 is reflected by a reflecting mirror 3 and is incident on an optical integrator (fly-eye lens) 5 through a lens system 4. The light source 1 may comprise a bright line lamp such as a mercury lamp a laser source such as a KrF or ArF excimer laser, or a harmonic laser such as a metal vapor laser or a YAG laser. In the form shown, the light is generated by an extra-high-voltage mercury lamp with an associated elliptical mirror 2 provided to reflect light to the mirror 3. A shutter 19 is arranged at the second focal point of the elliptical mirror 2 to shut/open the optical path of the illumination light and control the amount of light radiated on a reticle 11. The light emerging from the fly-eye lens 5 is incident on a beam splitter 7 such as a fiber bundle through a lens system 6.

The beam splitter 7 splits light received from an incident portion 7i into a plurality of beams. The plurality of beams emerge from a plurality of exit portions 7a and 7b. Although the two exit portions 7a and 7b are used in this embodiment, any number of exit portions can be used in accordance with the periodicity of fine patterns 12 of the reticle 11. The exit surfaces of the exit portions 7a and 7b are formed within a plane (illumination optical system pupil plane) 15 (or a conjugate plane) serving as a Fourier transform plane through lens systems 8 and 10 and a reflecting mirror 9 with respect to a surface of the reticle 11 on which the patterns 12 are formed, or within an adjacent plane. The distances from the exit portions 7a and 7b to an optical axis AX are uniquely determined in accordance with the incident angle of the illumination light on the reticle 11 which corresponds to the fineness (minimum pattern pitch) of the fine patterns 12.

The plurality of beams emerging from the exit portions 7a and 7b illuminate the reticle 11 placed on a reticle stage RS, at a predetermined incident angle, through the lens system 8, the reflecting mirror 9, and the lens system 10 at an almost uniform illuminance. Diffracted light components generated by the patterns 12 of the reticle 11 are incident on a both-side (or single-side) telecentric projection optical system 13. The projection optical system 13 then focuses and transfers images of the patterns 12 on a wafer 14 placed on a wafer stage WS. A control device 20 controls an opening/closing operation of the shutter 19. In addition, the control device 20 adjusts the positions of the exit portions 7a and 7b (i.e., the distances from the central positions of the exit portions 7a an 7b to the optical axis AX) within the pupil plane 15 in accordance with the fineness (including periodicity and directional property) of the reticle patterns 12, and performs overall control of the apparatus.

Note that While a fiber bundle is used as the beam splitter 7 for splitting the illumination light in the illustrative embodiment, other members such as a diffraction grating and a polygonal prism may be used. In addition, the beam splitter 7 need not be used if the size (cross-sectional area) of each element of the fly-eye lens 5 is reduced, and a spatial filter having a plurality of openings (corresponding to the exit portions 7a and 7b) is arranged near the exit surface (reticle-side focal plane) of the fly-eye lens 5. That is, any arrangement can be employed as long as the illumination light passing through the pupil plane of the illumination optical system or its conjugate plane can be limited to at least one local region having the center at a position shifted from the optical axis of the illumination optical system.

Referring to FIG. 1, the exit surface of the fly-eye lens 5, the exit surface of the beam splitter 7, (the pupil plane 15 of the illumination optical system) and a pupil plane (Fourier transform plane) 18 of the projection optical system 13 are substantially conjugate with each other. In addition, the incident surface of the fly-eye lens 5, the incident surface of the beam splitter 7, the pattern surface of the reticle 11, and the surface of the wafer 14 are substantially conjugate with each other. Note that a wavelength selection element (e.g., an interference filter) may be added in the illumination optical system in accordance with correction states of chromatic aberration of the projection optical system 13 and the components 1 to 10 of the illumination optical system.

In order to improve the illuminance uniformity on a reticle (or a wafer), another fly-eye lens may be additionally arranged at a position on the reticle 11 side of the beam splitter 7, i.e., near the exit surfaces of the exit portions 7a and 7b, so as to form a two-stage integrator structure. In this case, the fly-eye lens at the second side (on the reticle stage) may comprise one large fly-eye lens covering the entire pupil plane 15 of the illumination optical system or a plurality of fly-eye lenses corresponding to the number of exit portions. Note that the fly-eye lens 5 at the first stage (on the light source side) may also comprise a plurality of fly-eye lenses. The reticle-side focal plane (exit-side focal plane) of the fly-eye lens at the second stage is located within a plane near the pupil plane 15 of the illumination optical system. Furthermore, the exit surface of the fly-eye lens 5 serves as a Fourier transform plane with respect to the incident surface of the fly-eye lens at the second stage. However, the relationship of Fourier transform need not be strictly maintained between the two fly-eye lenses as long as beams emerging from the respective elements of the fly-eye lens 5 are superposed on each other on the incident surface of the second stage fly-eye lens. In this embodiment, a fly-eye type integrator is used as the optical integrator 5. However, for example, a prism-like rod type integrator may be used. Furthermore, the above-described two-stage integrator structure may be constituted by a prism-like rod type integrator and a fly-eye type integrator. Since such an arrangement is disclosed in, e.g., U.S. Pat. No. 4,952,815, a description thereof will be omitted.

When a reticle having patterns whose pitch is equal to or smaller than the resolving limit is illuminated by the conventional apparatus, only the 0th-order diffracted light component of the diffracted light components generated by the reticle patterns can pass through the projection optical system, and the patterns cannot be resolved. If, however, the reticle is illuminated by the apparatus having the above-described arrangement of the invention (FIG. 1), illumination beams emerging from the exit portions 7a and 7b of the beam splitter 7 are incident on the reticle 11 at a predetermined angle. For this reason, of the diffracted light components generated by the reticle patterns, two light components, i.e., one of the ±1st-order diffracted light components and the 0th-order diffracted light component can pass through the projection optical system 13. Therefore, interference fringes caused by these two light components are formed on the wafer 14, and finer patterns having smaller pitches can be resolved. The arrangement of the projection exposure apparatus of the embodiment has been described in detail above. The details of this arrangement are disclosed in, e.g., U.S. Ser. No. 791,138 (Nov. 13, 1991).

Figure 4:
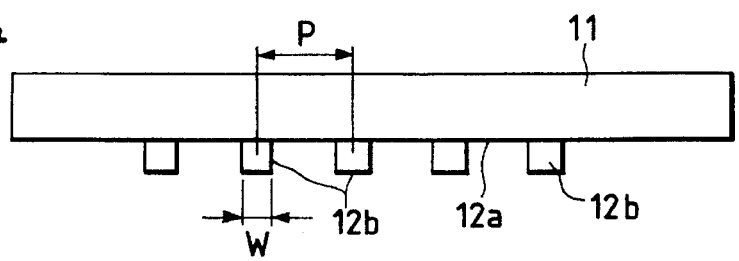
FIG. 4 is a view showing an arrangement of patterns of a reticle used in the embodiment.

The pattern of a reticle used in the embodiment of the present invention will be described next with reference to FIG. 4. FIG. 4 shows a reticle pattern suitable for the projection exposure apparatus of the embodiment, specifically a shifter light-shielding type phase shift reticle.

Referring to FIG. 4, a reticle 11 is designed such that phase shift patterns (transmission portions, each constituted by a dielectric thin film or the like) 12b constituting a circuit pattern 12 are arranged on one surface of a glass substrate (e.g., a quartz substrate having a transmittance of 90% or more with respect to illumination light) at a pitch P. Therefore, the circuit pattern 12 is a so-called line and space pattern (duty ratio (a=W/P) will be described later) consisting of alternate transmission portions (reticle bare surface portions) 12a and the phase shift transmission portions 12b.

The phase of light transmitted through each phase shift transmission portion 12b is different from that of light transmitted through each transmission portion 12 by (2n +1)π (n is an integer). A pattern width W of each phase shift transmission portion 12b is set to be equal to or smaller than the resolving limit of the projection optical system 13. The phase shift transmission portions 12b are formed as follows. A phase shift material (transparent dielectric member), e.g., a material (e.g., an SOG or a PSG) consisting of $SiO_2$ or $SiO_2$ containing an organic substance is formed on almost the entire surface of a glass substrate to have a thickness corresponding to the above-mentioned phase difference. The resultant structure is then patterned by an electron beam drawing unit. Therefore, the circuit pattern 12 shown in FIG. 4 can be formed by one patterning operation. For this reason, in comparison with the spatial frequency modulation type phase shift reticle, the shifter light-shielding type phase shift reticle does not require strict positioning of the light-shielding layers and the phase shifter layers, and can be manufactured very easily.

In the arrangement shown in FIG. 4, the portions where the above-mentioned phase shift material is left are defined as phase shift transmission portions. However, the portions where the phase shift material is left may be defined as transmission portions, while the portions where the phase shift material is removed are defined as phase shift transmission portions (whose pattern width is set to be equal to or smaller than the resolving limit of the projection optical system). In addition, part of the pattern surface of the reticle 11 shown in FIG. 4 may include a pattern constituted by light-shielding portions (each constituted by a metal film consisting of chromium). In this case, since a fine pattern portion is constituted by only the above-described transmission portions and phase shift-transmission portions, strict positioning is not required between patterning of the phase shift material and patterning of the light-shielding material. Therefore, the reticle used in the embodiment of the present invention is not difficult to manufacture, even if its structure includes a light-shielding pattern portion, unlike the spatial frequency modulation type phase shift reticle.

An exposure method will be described below with reference to FIG. 5, in which the shifter light-shielding type phase shift reticle is illuminated with illumination light passing through at least one local region having the center at a position shifted from the optical axis AX on the pupil plane of the illumination optical system, and an image of a reticle pattern is focused and projected on a wafer by the projection optical system.

Figure 5:
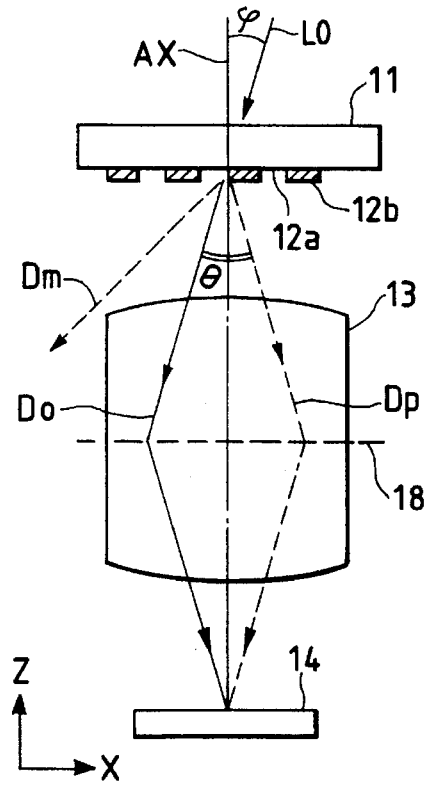
FIG. 5 is a view showing a state wherein diffracted light components are generated by a circuit pattern and are focused when the reticle is illuminated in the projection exposure apparatus according to the embodiment of the present invention.

FIG. 5 shows a state wherein light is diffracted by a circuit pattern and the resultant diffracted light components are focused when a reticle is illuminated in the projection exposure apparatus according to the embodiment of the present invention. A one-dimensional line and space pattern, as the circuit pattern 12, constituted by the transmission portions 12a and the phase shift transmission portions 12b is drawn on the lower surface (on the side of the projection optical system 13) of the reticle 11 (FIG. 4).

In the projection exposure apparatus (FIG. 1) used in the embodiment, the local region through which the illumination light passes, as described above, has the center at a position shifted from the optical axis within the pupil plane 15 of the illumination optical system. Illumination light L0 for illuminating the reticle 11 is incident on the reticle 11 at an incident angle φ from a direction (Z direction) substantially perpendicular to the direction (periodic direction) in which the pattern 12 of the reticle 11 is drawn. Note that the incident angle φ and the incident direction are uniquely determined by the positions of diffracted light components, generated by the pattern on the reticle, within the pupil plane of the projection optical system.

A 0th-order diffracted light component $D_0$, a +1st-order diffracted light component $D_p$, and a −1st-order diffracted light component $D_m$ are generated by the pattern on the reticle in diffraction angles corresponding to the fineness (width and pitch) of the pattern. Referring to FIG. 5, of the above-mentioned three light components, two light components, i.e., the 0th-order diffracted light component $D_0$ and the +1st diffracted light component $D_p$, pass through the projection optical system 13 and reach the wafer 14. These two light components form interference fringes, i.e., an image of the pattern 12, on the wafer 14. FIG. 5 shows the positions of the 0th-order diffracted light component and the +1st-order diffracted light component on the pupil plane 18 of the projection optical system 13 (to be described in detail later).

Figure 12A:
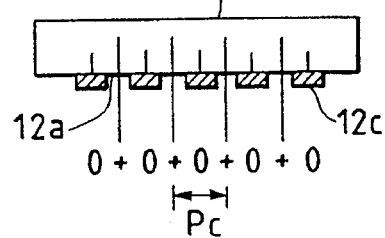
FIGS. 12A and 12B are views showing the arrangement of a conventional reticle, and the light intensity distribution of pattern images on a wafer which are obtained when exposure is performed by using the reticle.

Note that the resolving limit of a pattern formed by the conventional exposure method is determined depending on whether ±1st-order diffracted light components can pass through the projection optical system, as described with reference to FIG. 12. That is, in the conventional method, if the pattern pitch is represented by P, the pattern size given by $P > \lambda/NA$ or a value close to this becomes the resolving limit. In contrast to this, in the projection exposure apparatus according to the embodiment of the present invention, the pattern size given by $P > \lambda/2NA$ or a value close to this becomes the resolving limit. This applies not only to the pattern of a reticle used (e.g., shown in FIG. 4) in the projection exposure apparatus according to the embodiment of the present invention but also to the pattern of a conventional reticle.

Referring to FIG. 5, the 0th-order diffracted light component $D_0$ and the +1st-order diffracted light component $D_p$ propagate in optical paths symmetrical about the optical axis AX. This arrangement can be realized by setting the incident angle $\phi$ of the illumination light L0 to be $\sin\theta = \sin\theta/2 = \lambda/2P$. In this case, while the wafer 14 is in a defocus state, the 0th-order diffracted light component $D_0$ and the +1st-order diffracted light component $D_p$ cause almost the same amount of wave aberration (based on the defocus state). This is because the wave aberration corresponding to a defocus amount $\Delta F$ is given by $\frac{1}{2} \times \Delta F \sin^2 t$ (where t is the incident angle of each diffracted light component on the wafer), and incident angles t of the 0th-order diffracted light component and the +1st-order diffracted light component on the wafer are substantially equal to each other.

A cause of distortion (blurring) of a pattern image on a wafer is the difference in wave aberration between the respective light components. In the apparatus (e.g., shown in FIG. 5) used in the embodiment of the present invention, since the wave aberrations caused by the 0th-order diffracted light component $D_0$ and the +1st-order diffracted light component $D_p$ radiated on the wafer are almost the same, the same defocus amount $\Delta F$ causes a lower degree of blurring than that in the conventional exposure apparatus. That is, a large depth of focus is obtained.

Figure 12B:
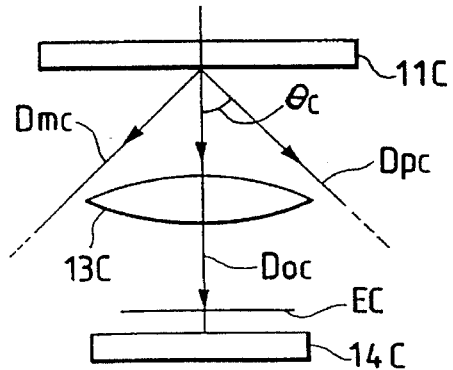
Figure 13:
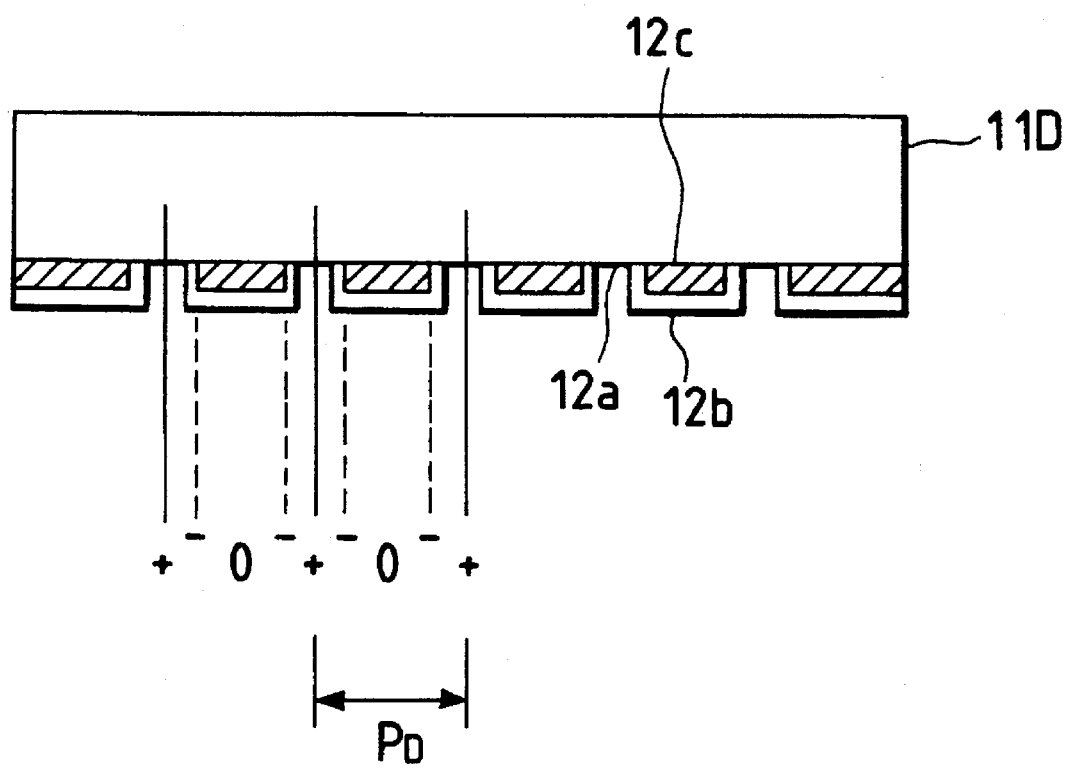
FIG. 13 is a view showing the arrangement of an edge emphasizing type phase shift reticle.

In the conventional exposure apparatus, as shown in FIG. 12B, the 0th-order diffracted light component $D_{OC}$ propagates almost on the optical axis (t=0), and the ±1st-order diffracted light components $D_{pC}$ and $D_{mC}$ are incident on the wafer at an angle t given by $\sin t = \lambda/P'$ (P' is the brightness pitch of a pattern image on the wafer) (assume that $\sin\theta_c < NA_R$). Therefore, the difference between the wave aberrations is represented by $\frac{1}{2} \times \Delta F (\lambda/P')^2 - \frac{1}{2} \times \Delta (0^2)$. That is, an aberration of $\frac{1}{2} \times \Delta F (\lambda/P')^2$ is caused by the defocus amount $\Delta F$.

In the arrangement shown in FIG. 5, the 0th-order diffracted light component $D_0$ and the +1st-order diffracted light component $D_p$ are set to be substantially symmetrical about the optical axis AX. However, in order to increase the depth of focus, these two diffracted light components need not be symmetrical about the optical axis AX within the pupil plane 18 but may pass through positions substantially equidistant from the optical axis AX.

In this case, the fineness (line width and pitch) and directional property of a pattern of a reticle used in the exposure apparatus is not restricted to one type. For this reason, the central positions of local regions on the pupil plane 15 through which illumination beams pass, i.e., the positions of the exit portions 7a and 7b of the beam splitter (fiber bundle) 7 shown in FIG. 1 on the pupil plane 15 of the illumination optical system, are preferably made to be variable in accordance with the type of pattern. This is because the incident direction and incident angle of illumination light on a reticle are determined by the direction in which a pattern is drawn, and the depth and pitch of the pattern. For example, in the case of the one-dimensional line and space pattern arranged in the X direction, as shown in FIG. 5, the illumination light L0 may be radiated on the pattern 12 from the direction indicated in FIG. 5. That is, the illumination light L0 is incident on the reticle 11 in a direction parallel to the drawing. If the incident angle of the illumination light L0 is determined such that the 0th-order diffracted light component $D_0$ and the +1st-order diffracted light component $D_p$ generated by the pattern 12 pass through positions almost equidistant from the optical axis AX on the pupil plane 18, the depth of focus of an image on the wafer 14 can be increased.

The eccentric direction of the central position of the local region, with respect to the optical axis AX within the pupil plane of the illumination optical system, through which each illumination beam passes is determined in accordance with the incident direction determined in this manner. The eccentric amount of each illumination beam with respect to the optical axis AX is determined in accordance with the incident angle determined by the line width and periodicity of a pattern. The central position of the local region, within the pupil plane of the illumination optical system, through which each illumination beam passes is determined in the above-described manner.

When patterns drawn in the two-dimensional directions are to be illuminated, illumination beams are preferably radiated from two directions in accordance with the directions of the respective patterns. In addition, instead of using two illumination beams in two directions, it is preferable to use a total of four beams, including the above-mentioned two illumination beams and two beams symmetrical therewith about the optical axis of the projection optical system. In this case, since the light amount barycentric directions of these beams coincide with the optical axis of the projection optical system, lateral shifts (telecentric shifts) of images, caused when the wafer is slightly defocused, can be prevented. Similarly, a reticle having a one-dimensional line and space pattern as shown in FIG. 5 may be obliquely illuminated with two beams substantially symmetrical about the optical axis of the projection optical system. Note that when a one-dimensional pattern is to be illuminated, as long as the intensity ratio of the 0th-order diffracted light component to each 1st-order diffracted light component generated by the pattern is accurately set to be 1:1, the pattern need not be illuminated with two beams from directions symmetrical about the optical axis. However, this applies to only a case wherein the pitch of a pattern is fixed to one value. The above-described case will be described in, detail below with reference to FIGS. 6 to 7D.

Figure 6:
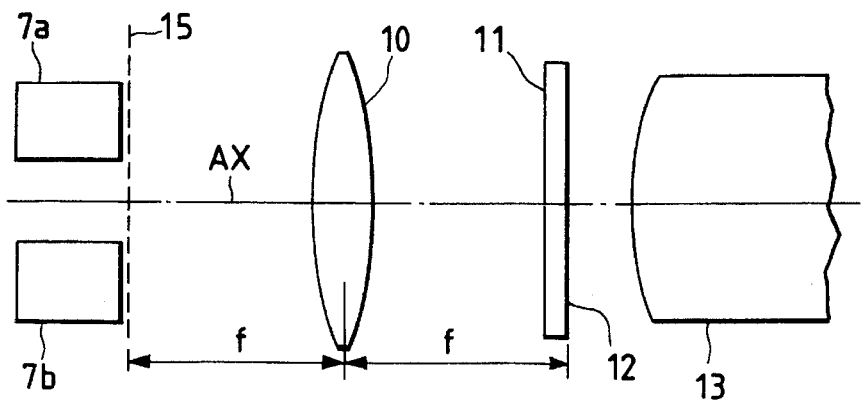
FIG. 6 is a view illustrating part of the projection exposure apparatus in FIG. 1.

FIG. 6 illustrates part of the apparatus (FIG. 1) used in the embodiment, specifically the components from the exit portions 7a and 7b of the fiber bundle or beam splitter 7 to the projection optical system 13 in FIG. 1. Note that the lens system 8 is omitted from FIG. 6. The exit ends of the exit portions 7a and 7b of the fiber bundle 7 almost coincide with the Fourier transform plane (illumination optical system pupil plane 15) of the reticle pattern 12. In this case, the focal length of a condenser lens 10 which establishes the relationship of Fourier transform between the pupil plane 15 of the illumination optical system and the pattern surface of the reticle 11 is represented by f, 10 as shown in FIG. 6.

Figure 7A:
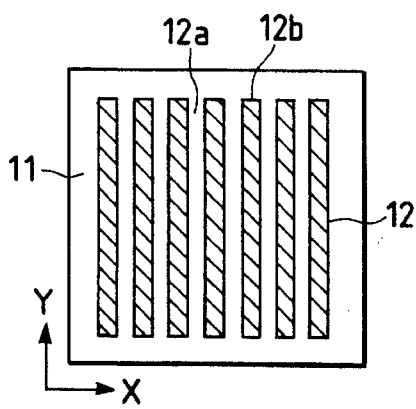
FIGS. 7A to 7D are views for explaining the arrangements of the patterns of reticles used in the embodiment of the present invention, and the arrangement of fiber bundle exit portions on the pupil planes of illumination optical systems corresponding to the reticle patterns.
Figure 7C:
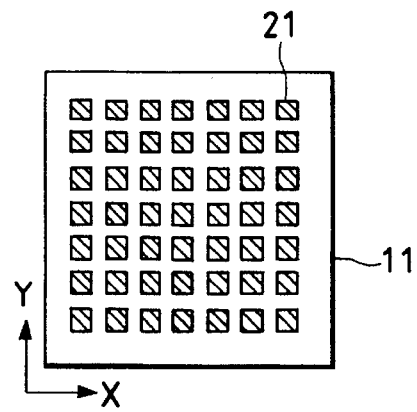
Figure 7B:
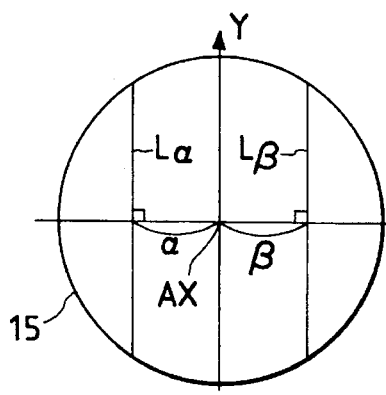
Figure 7D:
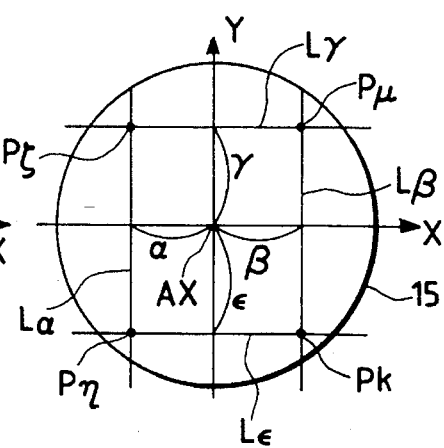

FIGS. 7B and 7D respectively indicate the positions of illumination beams (local regions), within the pupil plane 15 of the illumination optical system, which maximize the depths of focus with respect to reticle patterns 12 and 21 shown in FIGS. 7A and 7C (to be simply referred to as the positions of a secondary source group (surface light sources) hereinafter). Since the pupil plane 15 of the illumination optical system and the reticle pattern 12 have the relationship of Fourier transform, as described above, the positions of the secondary source groups (corresponding to the exit portions 7a and 7b or the exit end faces of the fly-eye lens group) within the pupil plane 15 of the illumination optical system correspond to sin $\phi$ of the incident angle $\phi$ (FIG. 5) of the illumination light L0 on the reticle 11. In this case, since the focal length of the condenser lens 10 is f, the distance from the central position of each of the exit portions 7a and 7b to the optical axis AX is represented by f×sin$\phi$.

FIG. 7A shows a so-called one-dimensional line and space pattern, in which transmission portions 12a and phase shift transmission portions 12b extend in the Y direction and are regularly arranged at a pitch P in the X direction. In this case, the optimal positions of the exit portions 7a and 7b (i.e., the positions of the secondary source group) are arbitrary positions on line segments L$\alpha$ and L$\beta$ in the Y direction which are assumed within the pupil plane 15 of the illumination optical system, as shown in FIG. 7B. FIG. 7B shows the pupil plane 15 of the illumination optical system corresponding to the reticle pattern 12 when viewed from the direction of the optical axis AX. Referring to FIG. 7B, the X-Y coordinate system defined within the pupil plane 15 coincides with that in FIG. 7A showing the reticle pattern 12 viewed from the same direction.

As shown in FIG. 7B, within the pupil plane 15, distances $\alpha$ and $\beta$ from the optical axis AX (pupil center) to the respective line segments L$\alpha$ and L$\beta$ are equal to $\alpha=\beta=$ f·(½)·($\lambda$/P) where $\alpha=\beta$ and $\lambda$ is the exposure wavelength. If these distances $\alpha$ and $\beta$ are represented by f×sin$\phi$, as described above, sin$\phi=\lambda$/2P, which value coincides with the above-mentioned numerical value. If, therefore, the central positions of the exit portions 7a and 7b (i.e., the barycentric directions of the light amount distributions of the secondary sources which are formed near the exit ends of the exit portions 7a and 7b by the fly-eye lens 5) are respectively located on the line segments L$\alpha$ and L$\beta$, one of the ±1st-order diffracted light components generated by the line and space pattern shown in FIG. 7A upon radiation of illumination light from each of the exit portions 7a and 7b, and the 0th-order diffracted light component, i.e., two light components, pass through positions substantially equidistant from the optical axis AX within the pupil plane 18 of the projection optical system 13. Therefore, as described above, the depth of focus with respect to the line and space pattern (FIG. 7A) can be maximized, and a high resolution can be obtained.

FIG. 7C shows a case wherein a reticle pattern is an isolated space pattern. Assume that the pitches of the pattern 21 in the X and Y directions (lateral and longitudinal directions) are respectively represented by Px and Py. FIG. 7D shows the optimal positions of the exit portions 7a and 7b (secondary source group) in this case. The positional and rotational relationships between FIGS. 7C and 7D are equivalent to those between FIGS. 7A and 7B. In the case of the two-dimensional pattern 21, four local regions (illumination beams) are preferably formed within the pupil plane 15 of the illumination optical system. Therefore, in the apparatus (FIG. 1) having the above-described arrangement, the beam splitter 7 may have four exit portions.

When illumination light is incident on the two-dimensional pattern 21 shown in FIG. 7C, diffracted light components are generated in the two-dimensional directions corresponding to the periodicity (X: Px, Y : Py) of the pattern 21 in the two-dimensional directions. Even with respect to the two-dimensional pattern 21 shown in FIG. 7C, if one of the ±1st-order diffracted light components and the 0th-order diffracted light component, of all the diffracted light components, are caused to pass through positions almost equidistant from the optical axis AX within the pupil plane 18 of the projection optical system 13, the depth of focus can be maximized. Since the pitch of the pattern 21 in FIG. 7C in the X direction is Px, if the centers of the exit portions (secondary source group) are located on the line segments L$\alpha$ and L$\beta$ given by $\alpha=\beta=$f·(½)·($\lambda$/Px), as shown in FIG. 7D, the depth of focus can be maximized. Similarly, if the centers of the two exit portions (secondary source group) are located on line segments L$\gamma$ and L$\epsilon$ given by $\gamma=\epsilon$f·(½)·($\lambda$/Py), the depth of focus with respect to the Y-direction components of the two-dimensional pattern 21 can be maximized.

When illumination light from the exit portion (secondary source group) arranged at each position within the pupil plane 15 shown in FIG. 7B or 7D is incident on the reticle pattern 12 or 21, either the +1st-order diffracted light component $D_p$ or the −1st-order diffracted light component $D_m$ and the 0th-order diffracted light component $D_0$ from the reticle pattern pass through positions substantially equidistant from the optical axis AX within the pupil plane 18 of the projection optical system 13. Therefore, as described above, a projection exposure apparatus having a high resolution and a large depth of focus can be realized.

In this case, only the two patterns shown in FIGS. 7A and 7C are exemplified as reticle patterns. However, the present invention can be applied to other patterns, if the central position of each exit portion (secondary source group) within the pupil plane 15 of the illumination optical system is set in consideration of the periodicity (fineness) of each pattern in such a manner that either a +1st-order diffracted light component or a −1st-order diffracted light component and a 0th-order diffracted light component, i.e., two light components from the pattern pass through positions substantially equidistant from the optical axis AX within the pupil plane 18 of the projection optical system 13. Note that one of other diffracted light components, e.g., ±second-order diffracted light components, and a 0th-order diffracted light component may be located at positions substantially equidistant from the optical axis AX within the pupil plane of the projection optical system.

In a case wherein a reticle pattern includes a two-dimensional periodic pattern as in FIG. 7D, when a specific 0th-order diffracted light component is considered, diffracted light components of first or higher orders distributed in the X direction (first direction) and the Y direction (second direction) can exit around the specific 0th-order diffracted light component. Assume that a specific 0th-order diffracted light component generated by the two-dimensional pattern is to be properly focused. In this case, the position of the specific 0th-order diffracted light component (one exit portion as a secondary source) may be adjusted such that one of the higher order diffracted light components distributed in the first direction, one of the higher order diffracted light components distributed in the second direction, and the specific 0th-order diffracted light component, i.e., a total of three light components, are distributed to be substantially equidistant from the optical axis AX on the pupil plane 18. For example, in FIG. 7D, the central potion of each secondary source may be caused to coincide with one of points Pζ, Pη, Pκ, and Pμ. Each of the points Pζ, Pη, Pκ, and Pμ is an intersection point between the line segment Lα or Lβ (corresponding to an optimal position in terms of the periodicity in the X direction, i.e., a position at which the 0th-order diffracted light component and one of the ±1st-order diffracted light components in the X direction are substantially equidistant from the optical axis on the pupil plane 18 of the projection optical system) and the line segment Lγ or Lε (an optimal position in terms of the periodicity in the Y direction). Therefore, each point is an optimal light source position in either the X direction or the Y direction as a pattern direction.

In the above description, a pattern having a two-dimensional directional property at the same position on the reticle is assumed as a two-dimensional pattern. However, the above-described method can be applied to a case wherein a plurality of patterns having different directional properties are present at different positions in the same reticle pattern. If a pattern on a reticle has a plurality of directional and fineness properties, the optimal position of each secondary source is set in accordance with each directional property and fineness of the pattern. However, each secondary source may be located at the average position of optimal positions. In addition, this average position may be a weighted average position set in consideration of weights corresponding to the fineness and importance of the pattern.

The beams emerging from the respective exit portions (secondary source group) are obliquely incident on the reticle. At this time, if the light amount barycentric directions of these oblique incident beams are not perpendicular to the reticle, the position of a transferred image is shifted along the wafer surface when the wafer 14 is slightly defocused. In order to prevent this, the light amount barycentric directions of the illumination beams from the respective secondary source groups are set to be perpendicular to the reticle pattern, i.e., parallel to the optical axis AX. More specifically, when optical axes (central lines) are assumed for the respective secondary the products of position vectors within the Fourier transform planes of the optical axes (central lines) with reference to the optical axis AX of the projection optical system 13 and the amounts of light emerging from the respective exit portions may be set to be zero.

In a simpler method, 2m (m is a natural number) secondary sources are provided, and the positions of the m light sources are determined by the above-described optimizing method (FIGS. 7A to 7D), while the remaining m secondary sources are located at positions symmetrical to the former m secondary sources about the optical axis AX.

Figure 2:
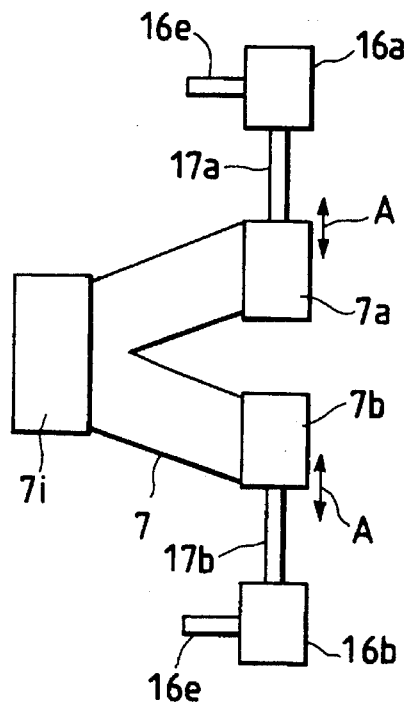
FIG. 2 is a view showing a detailed arrangement of a beam splitter and driving members of the projection exposure apparatus in FIG. 1.
Figure 3:
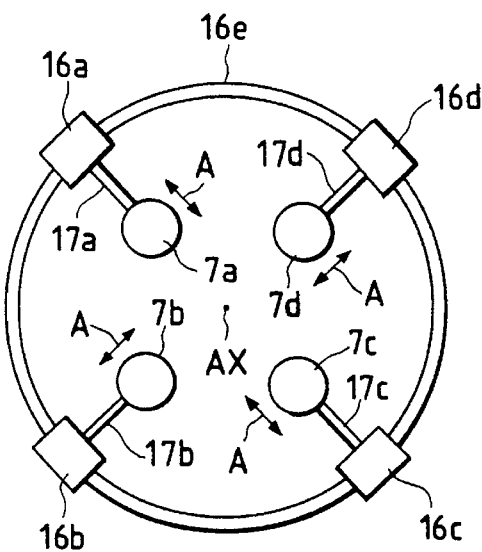
FIG. 3 is a view showing another arrangement of a beam spitter and driving members of the projection and exposure apparatus in FIG. 1.

The projection exposure apparatus according to the embodiment of the present invention preferably includes a light amount distribution adjusting function as in FIGS. 2 and 3. An arrangement of exit portions and driving members will be briefly described below with reference to FIGS. 2 and 3.

FIGS. 2 and 3 show a schematic arrangement of a beam splitter and driving members which are suitable for the projection exposure apparatus according to the embodiment of the present invention. FIG. 2 shows the arrangement viewed from a direction perpendicular to the optical axis of the projection exposure apparatus. FIG. 3 shows the arrangement viewed from the direction of the optical axis. In this arrangement, four points are set on the pupil plane of the illumination optical system as points through which principal beams of illumination light pass. Exit portions 7a, 7b, 7c, and 7d are respectively connected to driving members 16a, 16b, 16c, and 16d through variable support rods 17a, 17b, 17c, and 17d so as to be movable in the directions indicated by corresponding double-headed arrow A. The driving members 16a, 16b, 16c, and 16d are movably supported on a support member 16e to be movable on a circumference (a plane perpendicular to the surface of FIG. 2) centered on the optical axis AX. With this mechanism, the positions through which principal beams pass can be moved to arbitrary positions on the Fourier plane 15. The mechanism having the above-described arrangement is applied to the two-dimensional pattern 21 shown in FIG. 7C. Note that the number of the exit portions 7a, 7b, 7c, and 7d is not limited to four but may be set to be an optimal number in accordance with the type of pattern of a reticle to be used.

When the shifter light-shielding phase shift reticle 11 (FIG. 4) is obliquely illuminated in the manner shown in FIG. 5, the intensity ratio of the 0th-order diffracted light component $D_0$ to the 1st-order diffracted light component $D_p$, generated by the reticle pattern 12, changes in accordance with the width W of each phase shift transmission portion 12b. The intensity ratio (0th-order diffracted light component: 1st-order diffracted light component) is quantitatively represented by $$(1-2a)^2 : 4 \cdot \sin^2(\pi a)/\pi^2$$

where a=W/P.

Figure 10A:
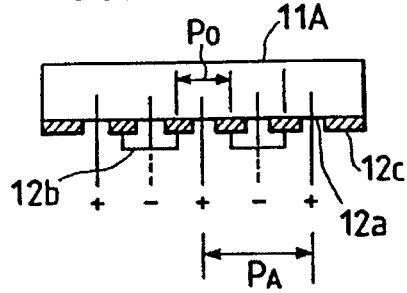
FIGS. 10A and 10B are views showing the arrangement of a spatial frequency modulation type phase shift reticle, and the light intensity distribution of pattern images on a wafer which are obtained when exposure is performed by using the reticle.
Figure 10B:
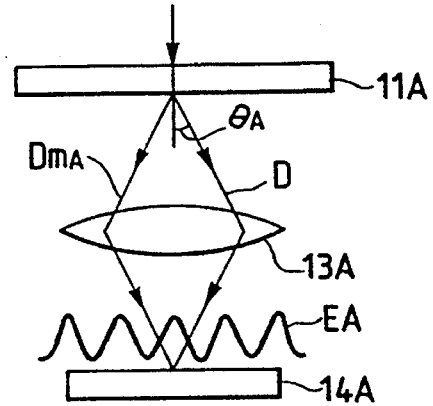

In this case, if a=½, i.e., W=P/2, the intensity of the 0th-order diffracted light component becomes zero. This phenomenon occurs for the same reason as that described with reference to the spatial frequency modulation type phase shift reticle (FIG. 10). That is, transmitted light (+) from each of the transmission portions 12a and transmitted light (−) from a corresponding one of the phase shift transmission portions 12b cancel each other.

Note that the present invention is applied to a case wherein the width W is set to be P/2 or less. This is because the pattern width W is set to be equal to or smaller than the resolving limit of the projection optical system.

If a=0.265 or so in the above-mentioned intensity ratio, the intensity of the 0th-order diffracted light component is substantially equal to that of the +1st-order diffracted light component. That is, since the contrast of interference fringes caused by two (coherent) beams having substantially the same intensity is 100%, if a reticle with a=0.265 is used, the contrast of interference fringes (a reticle pattern image) on the wafer which are caused by the 0th-order diffracted light component and the +1st-order diffracted light component becomes 100%. If the conventional reticle (FIG. 12A) is used in the apparatus (FIG. 1) used in the embodiment of the present invention, when the duty ratio of the light-shielding portion to the transmission portion is 1:1, the intensity ratio of the 0th-order diffracted light component to the +1st-order diffracted light component is 1:0.4. In this case, the contrast of the interference fringes (image) is about 90%.

The light amounts of pattern images on a wafer will be compared with each other next. Assume that when the shifter light-shielding phase shift reticle with a=0.265 is used, the average value of the maximum and minimum values of a pattern image is 1. In this case, if the conventional reticle (duty ratio= 1:1) is used in the apparatus (FIG. 1) of the embodiment, the average value of the maximum and minimum values is about 0.80. In other words, if the shifter light-shielding phase shift reticle is used as in the embodiment, the same circuit pattern can be transferred with about 80% of the exposure amount set in the conventional apparatus. Therefore, the exposure time can be shortened, and the processing performance (throughput) is improved accordingly.

That only 80% of the exposure amount is required means that the amount of light which passes through a large-area transmission portion having no patterns and reaches a wafer is required to be only 80% of the light amount set in the conventional apparatus. Consequently, the amount of light passing through the projection optical system is reduced accordingly. That is, a decrease in amount of light radiated on a wafer serves to reduce thermal deformation (expansion) of the wafer due to the energy of the radiated light. In addition, a decrease in amount of light passing through the projection optical system is equivalent to a decrease in optical energy (thermal energy) absorbed by the projection optical system. Therefore, a deterioration in image quality (e.g., distortion and curvature of field) due to the generation of heat in the projection optical system can be reduced. These effects, however, are secondary. The primary effect is that the focusing characteristics of a fine pattern in a defocus state are improved with a decrease in the amount of light transmitted through the large-area transmission portion. This effect will be described below with reference to FIGS. 8A to 9B.

Figure 8A:
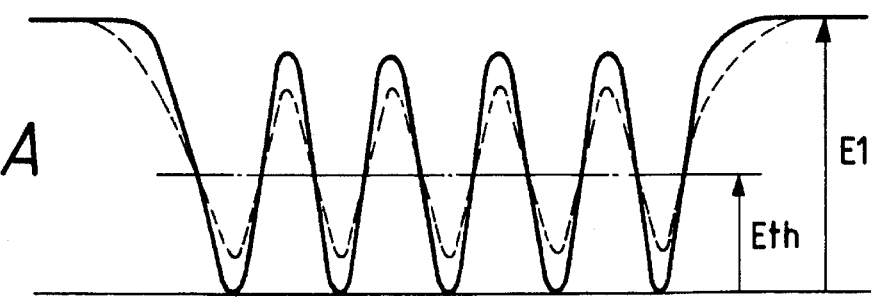
FIGS. 8A and 8B are charts showing images (light amount distribution) of the reticle patterns in FIG. 4, which can be obtained in the embodiment of the present invention.
Figure 8B:
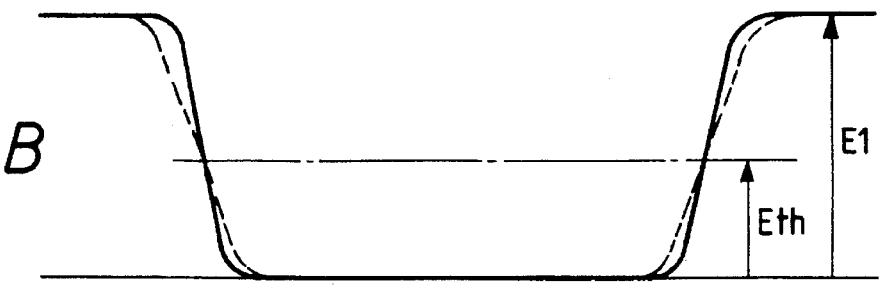
Figure 11A:
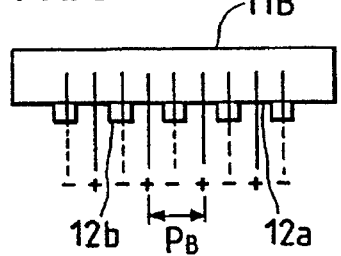
FIGS. 11A and 11B are views showing the arrangement of a shifter light-shielding type phase shift reticle, and the light intensity distribution of pattern images on a wafer which are obtained when exposure is performed by using the reticle.
Figure 11B:
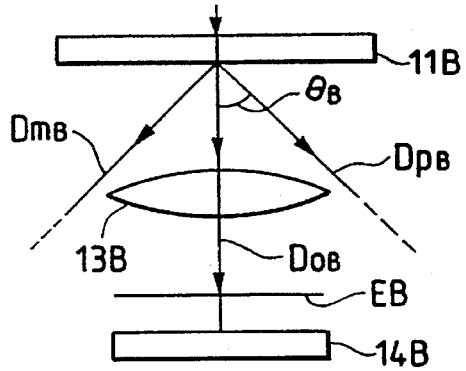

FIGS. 8A and 8B show an image (light amount distribution) of the reticle pattern shown in FIGS. 4 and 11A, in particular the line and space pattern. FIG. 8A shows a pattern image of the line and space pattern in the vertical sectional direction (periodic direction). FIG. 8B shows a pattern image in the horizontal sectional direction (perpendicular to the periodic direction). Referring to both FIGS. 8A and 8B, dark portions (zero light amount) correspond to the phase shift transmission portions 12b, and the solid lines indicate light amount distributions in an in-focus state, while the broken lines indicate light amount distributions in an out-of-focus state (defocus state).

Figure 9A:
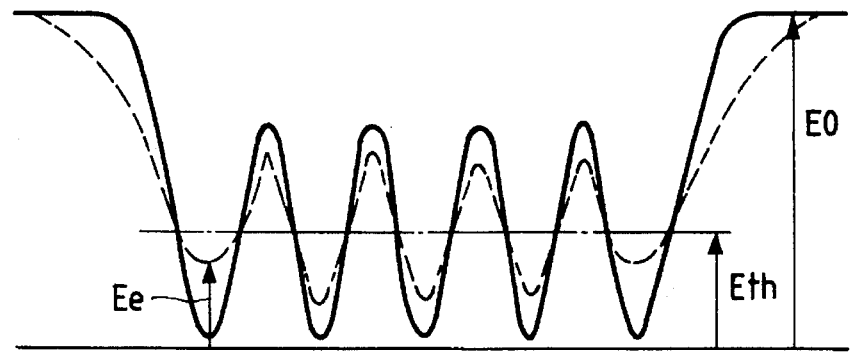
FIGS. 9A and 9B are charts showing pattern images (light amount distribution) obtained when a conventional reticle pattern is obliquely illuminated.
Figure 9B:
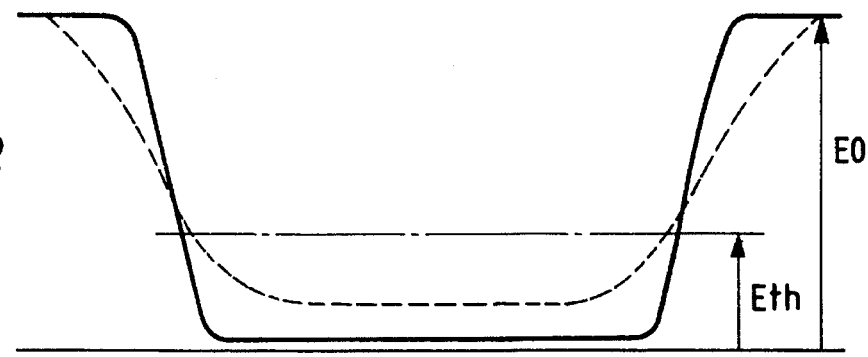

FIGS. 9A and 9B are similar to FIGS. 8A and 8B. FIGS. 9A and 9B show a case wherein a conventional reticle pattern constituted by only transmission portions and light-shielding portions is used.

Referring to FIGS. 8A to 9B, the light amount (exposure amount) required to completely remove a positive resist is represented by Eth. A light amount $E_1$ in FIGS. 8A and 8B, and a light amount $E_0$ in FIGS. 9A and 9B are respectively the amounts of light at the large-area transmission portions. Note that the line widths of the resist images of the line and space patterns shown in FIGS. 8A to 9B are set to be equal, and the light amount is set such that the point of the light amount distribution of each pattern, based on the exposure light amount Eth, is represented by 1:1 (in FIGS. 8A and 9A).

As a result, the ratio of the light amount $E_0$ to the light amount $E_1$ is 1:0.8. Therefore, the amount of light required for the line and space pattern portion of the conventional reticle is increased by 25% as compared with the case of the shifter light-shielding type phase shift reticle (FIGS. 8A and 8B) used in the embodiment of the present invention.

As is apparent from FIGS. 8A to 9B, there is not much difference in characteristics of the different reticles between the line and space images in a best focus state (solid lines).

In a defocus state (broken lines), however, in the use of the conventional reticle, an exposure operation is greatly influenced by light coming from peripheral portions other than the pattern portions (blurring), and images (light amount Ee) at the two ends of the line and space pattern cannot acquire sufficient darkness, as shown in FIG. 9A. As a result, when a positive resist is used, a decrease in line width and film thickness occurs. In addition, as shown in FIG. 9B, sufficient darkness cannot be obtained at the two ends of the pattern in the longitudinal direction (horizontal sectional direction). Consequently, if a positive resist is used, a considerable decrease in film thickness occurs at the two ends of the line pattern in the longitudinal direction.

As is apparent from FIGS. 8A and 8B, however, when the shifter light-shielding type phase shift reticle is used, since the amount of light from portions other than the pattern portions is relatively small, an exposure operation is not easily influenced by light coming from portions other than the pattern portions (blurring). This can reduce a decrease in line width and film thickness of the respective line patterns located at the two ends of the line and space pattern in a defocus state, and can reduce a decrease in film thickness at the two ends of the line pattern in the longitudinal direction. That is, even in a defocus state, a good resist profile can be obtained, and the practical depth of focus can be greatly increased. This effect is substantially the same as that obtained when the spatial frequency modulation type phase shift reticle, which is difficult to manufacture, is used in the conventional illumination scheme exposure apparatus.

When the spatial frequency modulation type phase shift reticle is to be used, a negative photoresist is required because of the arrangement of the reticle. However, a negative photoresist is inferior to a positive photoresist in resolution and stability. The combination of the shifter light-shielding type phase shift reticle and the oblique illumination scheme according to the embodiment of the present invention allows the use of a conventional high-performance positive photoresist.

In the apparatus (FIG. 1) used in the embodiment of the present invention, the numerical aperture for each beam illuminating the reticle, i.e., the coherent factor (so-called σ value) of the exposure apparatus, preferably falls within the range of about 0.1 to about 0.3. If the σ value is too small, the illumination uniformity on the reticle or the wafer tends to decrease. In contrast to this, as the σ value is large, the effect of the present invention is reduced.

In the above-described embodiment, the present invention is applied to the shifter light-shielding type phase shift reticle. However, the same effect as described above can be obtained even if the edge emphasizing type phase shift reticle capable of positioning the respective patterns in a self-aligned manner is used.

In addition, in the above embodiment, illumination light is limited to a local region having the center at a position shifted from the optical axis of the illumination optical system on the pupil plane 15 of the illumination optical system. However, even if illumination light is limited to an annular region on the pupil plane 15, substantially the same effect as that of the embodiment can be obtained. In this case, a light-shielding member (e.g., a shutter) is arranged near the pupil plane 15 (on the reticle side) so that light emerging from the annular region is partially shielded.

What is claimed is:

1. An exposure method of illuminating a pattern formed on a mask with illumination light from an illumination optical system, and projecting/exposing an image of said pattern on a photosensitive substrate through a projection optical system, wherein said pattern is constituted by a transmission portion having a transmittance of about 1 with respect to the illumination light and a phase shift transmission portion which provides a phase difference of about $(2n+1)\pi$ (n is an integer) with respect to the light transmitted through the transmission portion, and the illumination light passing through a predetermined plane which is substantially coincident with one of a Fourier transform plane of said mask in said illumination optical system or a conjugate plane thereto, is limited to a plurality of local regions of said predetermined plane having respective centers substantially equidistantly shifted from an optical axis of said illumination optical system to thereby illuminate said mask with a plurality of beams of illuminating light which are inclined with respect to said optical axis at substantially equal angles corresponding to a fineness of said pattern in a predetermined direction.

2. A method according to claim 1, wherein the inclination angles of said beams are determined by a line width and periodicity of said pattern, respective directions of said beams are determined according to a directional property of said pattern, and the positions of the centers of said local regions are adjusted in accordance with the corresponding beam angles and directions.

3. A method according to claim 1, wherein said centers of said local regions and said plurality of beams are disposed substantially symmetrically with respect to said optical axis.

4. An exposure method of illuminating a pattern formed on a mask with illumination light from an illumination optical system, and projecting/exposing an image of said pattern on a photosensitive substrate through a projection optical system, wherein said pattern is constituted by a transmission portion having a transmittance of about 1 with respect to the illumination light, a light-shielding portion having a transmittance of about 0 with respect to the illumination light, and a phase shift transmission portion which is formed around the light-shielding portion and provides a phase difference of about $(2n+1)\pi$ (n is an integer) with respect to the light transmitted through the transmission portion, and the illumination light passing through a predetermined plane which is substantially coincident with a Fourier transform plane of said mask in said illumination optical system or a conjugate plane thereto, is limited to a plurality of local regions of said predetermined plane having respective centers substantially equidistantly shifted from an optical axis of said illumination optical system to thereby illuminate said mask with a plurality of beams of illuminating light which are inclined with respect to said optical axis at substantially equal angles corresponding to a fineness of said pattern in a predetermined direction.

5. A method according to claim 4 wherein said centers of said local regions and said plurality of beams are disposed substantially symmetrically with respect to said optical axis.

6. An exposure apparatus comprising:

an illumination optical system for illuminating a pattern formed on a mask with illumination light;

a projection optical system for projecting an image of said pattern on a photosensitive substrate;

a member for holding a mask having a phase shifter portion for shifting the phase of the illumination light by about $(2n+1)\pi$ (n is an integer), at an object plane side of said projection optical system; and optical means for making a light amount distribution of the illumination light around a local region centered on an optical axis of said illumination optical system within a predetermined plane substantially coincident with one of a Fourier transform plane of said mask in said illumination optical system or a plane conjugate thereto stronger than a light distribution within said local region, so as to illuminate said mask with a plurality of beams of the illumination light which are inclined with respect to said optical axis at substantially equal angles corresponding to a fineness of said pattern.

7. An exposure apparatus according to claim 6, wherein said beams are substantially symmetrically disposed with respect to said optical axis.

8. An exposure apparatus comprising:

an illumination optical system for illuminating a pattern formed on a mask with illumination light;

a projection optical system for projecting an image of said pattern on a photosensitive substrate;

a member for holding a mask having a phase shifter portion for shifting the phase of the illumination light by about $(2n+1)\pi$ (n is an integer), at an object plane side of said projection optical system; and an optical member for making a light amount distribution of the illumination light around a local region centered on an optical axis of said illumination optical system within a predetermined plane substantially coincident with one of a Fourier transform plane of said mask in said illumination optical system or a plane conjugate thereto stronger than a light distribution within said local region, so as to illuminate said mask with a plurality of beams of the illumination light which are inclined with respect to said optical axis at substantially equal angles corresponding to a fineness of said pattern.

9. An exposure apparatus according to claim 8, wherein said beams are substantially symmetrically disposed with respect to said optical axis.

\* \* \* \* \*